(12) United States Patent
Takeuchi

(10) Patent No.: US 6,473,556 B1
(45) Date of Patent: Oct. 29, 2002

(54) APPARATUS FOR INSPECTING INTEGRATED CIRCUITS

(75) Inventor: Nobuaki Takeuchi, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 09/510,351

(22) Filed: Feb. 22, 2000

(30) Foreign Application Priority Data

Feb. 26, 1999 (JP) .......................................... 11-051946

(51) Int. Cl.⁷ ................................................. G02B 6/00
(52) U.S. Cl. ..................................................... 385/147
(58) Field of Search ............................. 385/80–90, 147

(56) References Cited

U.S. PATENT DOCUMENTS

| | | | | |
|---|---|---|---|---|
| 4,097,797 A | * | 6/1978 | Finet | 324/73 R |
| 4,875,006 A | * | 10/1989 | Henley et al. | 324/158 R |
| 5,329,188 A | * | 7/1994 | Sikkink et al. | 307/517 |
| 5,422,643 A | * | 6/1995 | Chu et al. | 341/141 |
| 5,801,959 A | * | 9/1998 | Ding et al. | 364/491 |
| 6,257,933 B1 | * | 7/2001 | Awaji | 439/660 |

* cited by examiner

Primary Examiner—Akm E. Ullah
(74) Attorney, Agent, or Firm—Burns, Doane, Swecker & Mathis, L.L.P.

(57) ABSTRACT

The apparatus for inspecting integrated circuits according to the present invention comprises: a test signal generating device that outputs an optical test signal; an optical distributor that distributes the optical test signal into a plurality of distributed optical signals by transmitting the optical test signal through a branching optical fiber network; and a plurality of pin cards each of which generates an electric test signal by performing phase adjustment of each distributed optical signal. The pin cards are arranged so as to apply the electrical test signals to pins of an integrated circuit to be inspected.

12 Claims, 9 Drawing Sheets

APPARATUS FOR INSPECTING INTEGRATED CIRCUITS

BACKGROUND OF THE INVENTION

1. Field of the Invention

The present invention relates to an apparatus for inspecting integrated circuits by applying test signals to integrated circuits as devices to be inspected (DUT).

2. Description of Related Art

Integrated circuit testers (IC testers) are conventionally used for inspecting integrated circuits. Because the conventional tester applies a phase signal (time based signal) to each pin of an integrated circuit to be inspected, it is necessary to provide the same number of signal cables as there are pins (for example, 1024 pins would require 1024 signal cables) in the vicinity of the integrated circuit.

However, because the sizes of recent integrated circuits have become smaller, it has become difficult to arrange and connect a large number of signal cables in the confined spaces around the integrated circuit. In particular, in the case where optical fibers are used so that phase signals to be applied to pins do not generate phase shifts due to line conditions such as impedance losses, it not only becomes more difficult to arrange and connect these optical fibers, but it also results in an increase in the manufacturing cost of the IC tester.

SUMMARY OF THE INVENTION

The objective of the present invention is to solve the above problems, that is, to miniaturize an inspection apparatus of integrated circuits by decreasing the use of hard-wiring such as optical fibers, and to improve precision in applying desired test signals to pins of integral circuits by preventing transmission losses and phase shifts (time shifts) of the signals.

To achieve the above objective, the apparatus for inspecting integrated circuits according to the present invention comprises:

- a test signal generating device that outputs an optical test signal;
- an optical distributor that distributes the optical test signal into a plurality of distributed optical signals by transmitting the optical test signal through a branching optical fiber network; and
- a plurality of pin cards each of which generates an electric test signal by performing phase adjustment of each distributed optical signal;
- wherein the pin cards are arranged so as to apply the electrical test signals to pins of an integrated circuit to be inspected.

According to the present invention, because the optical distributor distributes the optical test signal transmitted from the test signal generating device into a plurality of distributed optical signals, and the pin cards generate electric test signals by respectively performing phase adjustment of the distributed optical signals, it is possible to simplify the hardwiring between the test signal generating device and the pin cards, and the inspection apparatus can be miniaturized.

Furthermore, because an optical fiber can be used for the hardwiring between the test signal generating device and the optical distributor, it is not only possible to prevent cross talk of phase signals between pin cards, but also it is possible to reduce line noise, transmission loss, and deterioration in frequency characteristics.

The optical fiber network may comprise a plurality of optical fibers connected to each other via branch couplers to form a branching tree structure. For example, the branch coupler has a Y-shape.

The test signal generating device may further output phase control signals as well as the optical test signal, and each pin card may generate the electrical test signal having a phase delayed from that of the distributed optical signal by a time specified by each phase control signal. In this case, because the optical test signal is used as a master clock signal for phase adjustment of the electrical test signals, the accuracy in phases of the electrical test signals can be improved.

Only one optical fiber may be provided for transmitting the optical test signal to the optical distributor as a master clock signal which is a reference signal for the inspection.

The optical distributor may comprise a body having a cylindrical shape, and the branching optical fiber network may be fixed on the surface of the body so that output ends of the optical fiber network are arranged on an end of the body while forming a constant interval between neighboring output ends of the optical fiber network.

The optical distributor may have a cylindrical shape and be formed by bending a flexible plate on which the branching optical fiber network is fixed, and the branching optical fiber network may consist of a plurality of optical fibers connected to each other via branching couplers to form a tree structure.

The optical distributor may comprise a body having a disk portion and a plurality of protrusions standing up from the disk portion, and the branching optical fiber network may be fixed on the disk portion so that each of the output ends of the optical fiber network is fixed along each protrusion.

The optical distributor may have a disk shape and be formed by: providing the branching optical fiber network on a disk shaped plate so that terminal optical fibers of the optical fiber network are arranged radially toward the periphery of the plate; cutting the plate at both sides of the terminal optical fibers to form strip portions; and bending the strip portions so that they stand perpendicular to the disk shaped plate.

Each of the pin cards may comprise a light receiving element disposed facing each of the output ends of the optical fiber network for receiving each distributed optical signal.

The branching optical fiber network has a plurality of optical pathways extending from an input end to each output end thereof, and all the optical pathways have a constant length.

The branching optical fiber network consists of a plurality of optical fiber network units connected to each other in series.

An optical amplifier may be provided between the test signal generating device and the optical distributor for amplifying the optical test signal and applying amplified optical signals to the optical distributor.

Each of the pin cards may comprise a light receiving element, and the pin cards may be arranged spokewise around the optical distributor so that each light receiving element of each pin card faces each output end of the optical distributor.

DETAILED DESCRIPTION OF THE INVENTION

Figure 1:
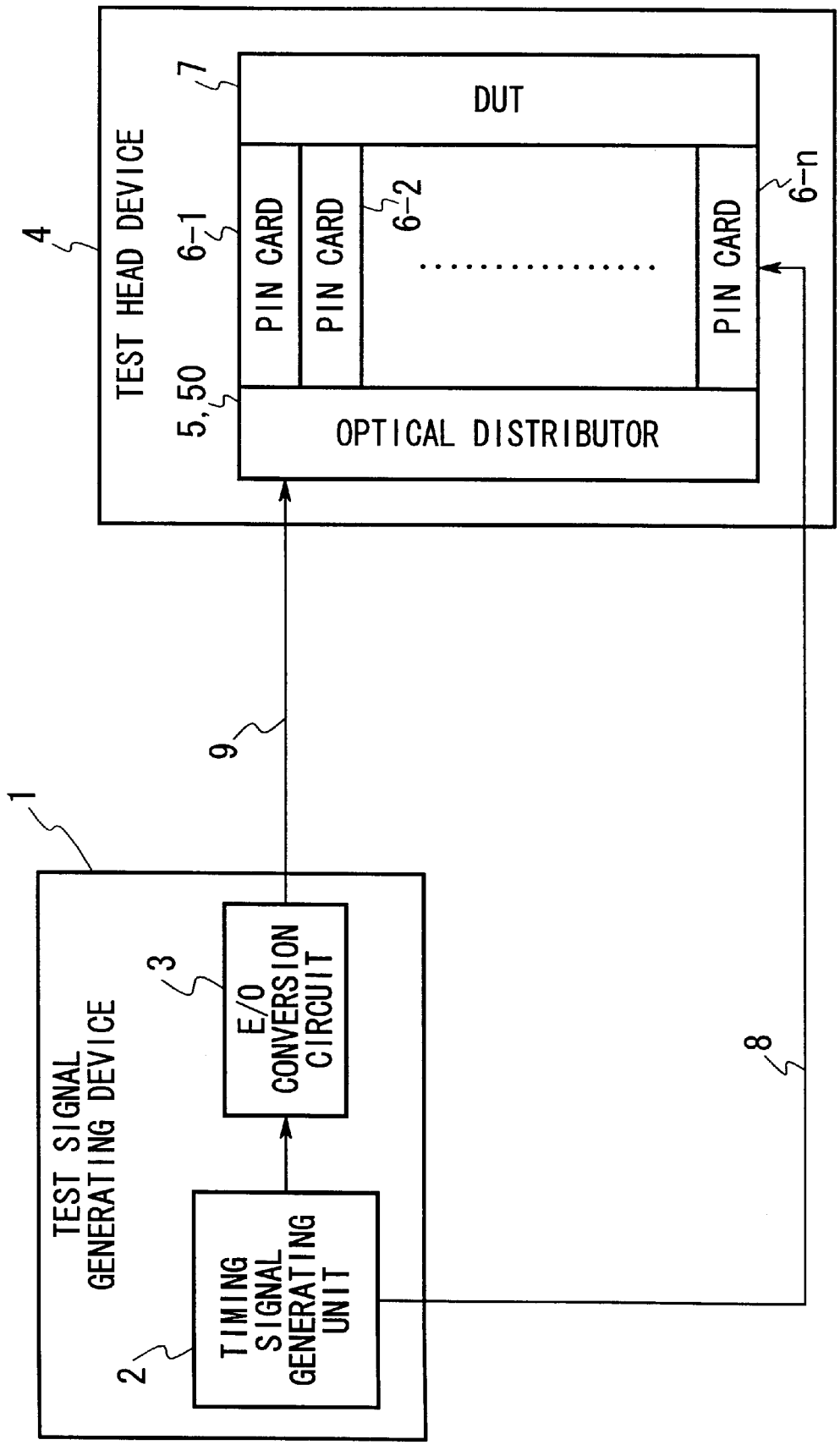
FIG. 1 is a block diagram illustrating a first embodiment of an apparatus for inspecting integral circuits according to the present invention.

FIG. 1 is a block diagram illustrating an apparatus for inspecting integrated circuits according to a preferred embodiment of the present invention. This inspection apparatus comprises a test signal generating device 1 and a test head device 4. The test signal generating device 1 comprises a timing signal generating unit 2 for generating an electrical timing signal as a test signal, and an electro-optic (E/O) conversion circuit 3 for converting the electrical timing signal into an optical master clock signal. The test head device 4 is for mounting an integrated circuit (semiconductor device) to be inspected thereon, and the test head device 4 comprises an optical distributor 5 connected to the electro-optic conversion circuit 3 via an optical fiber cable 9, and a plurality of pin cards 6-1, 6-2, ..., 6-n (where n is a natural number more than 2) connected to the optical distributor 5. The optical distributor 5 comprises a branching optical fiber network, and the optical distributor 5 distributes the master clock signal transmitted from the optical fiber cable 9 into a plurality of distributed master clock signals (distributed optical signals) by transmitting the master clock signal through the optical fiber network. Each of the pin cards 6-1~6-n receives each distributed master clock signal, and outputs an electric test signal having a desired phase from an output terminal provided thereon.

An integrated circuit to be inspected is placed so that pins of the integrated circuit 7 are respectively connected to the output terminals of the pin cards.

Figure 2:
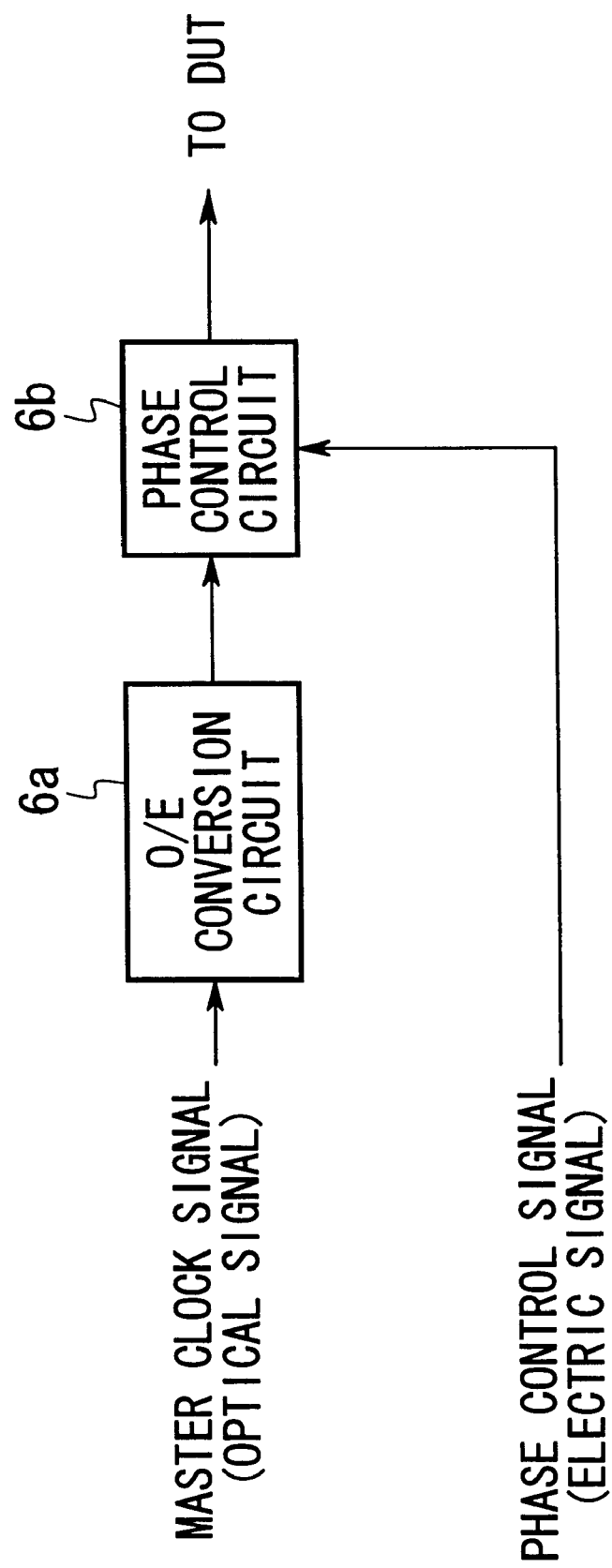
FIG. 2 is a block diagram illustrating the detail of a pin card used in the first embodiment.

The timing signal generating unit 2 is connected to the pin cards 6-1~6-n via electrical cables 8 for transmitting phase control signals to the pin cards 6-1~6-n. Each of the pin cards 6-1~6-n uses the distributed master clock signal as a reference signal, and generates an electric test signal delayed from the reference signal by a time specified by the phase control signal transmitted from the timing signal generating unit 2. The electric test signals output from the pin cards are applied to the pins of the integrated circuit 7. As shown in FIG. 2, each pin card comprises a photo-electric (O/E) conversion circuit 6a for converting the distributed master clock signal into an electric signal, and a phase control circuit 6b for adjusting the phase of the electric signal transmitted by the photo-electric conversion circuit 6a according to the phase control signal transmitted from the timing signal generating unit 2. The pin cards may comprise a circuit board on which the photo-electric conversion circuit 6a and the phase control circuit 6b are provided.

Figure 3A:
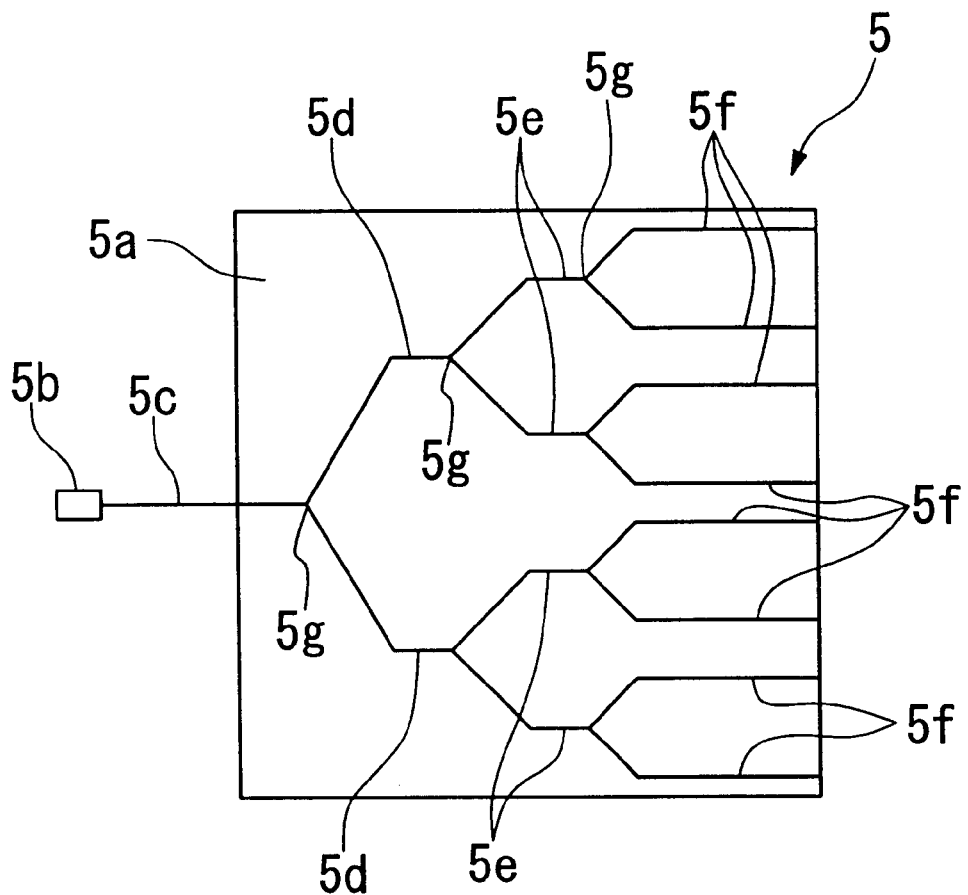
FIGS. 3A and 3B are schematic diagrams illustrating an example of an optical distributor used for the present invention.
Figure 3B:
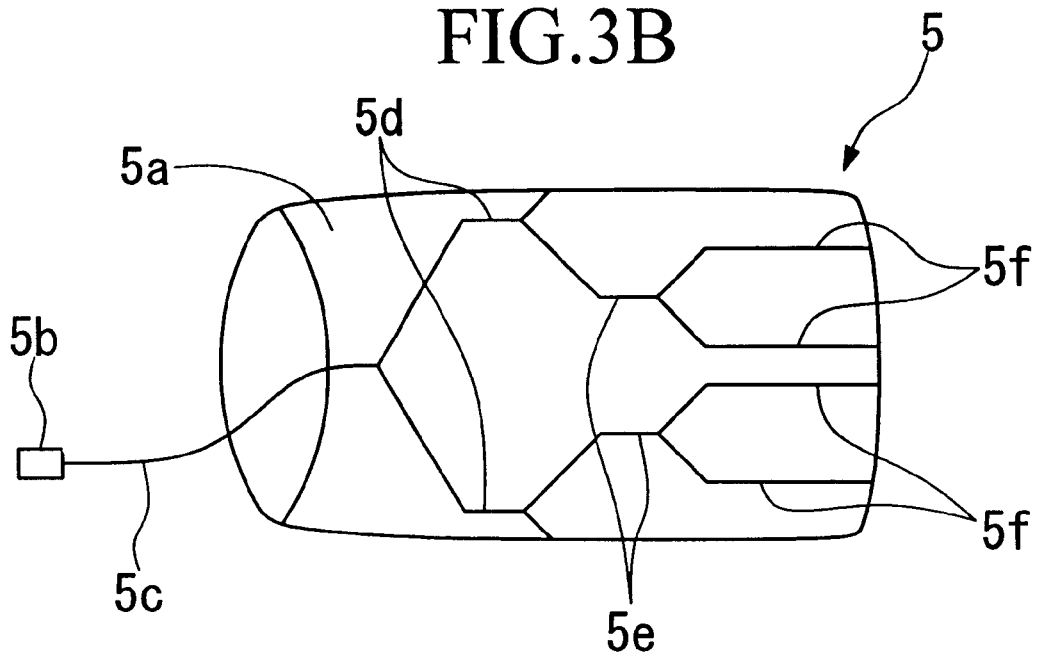

FIGS. 3A and 3B illustrate an example of the optical distributor 5. As shown in FIG. 3A, this optical distributor 5 comprises a flexible base 5a having a rectangular shape and formed by a flexible material such as a plastic sheet, and a branching optical fiber network (5c~5f) fixed on the flexible base 5a. The branching optical fiber network comprises a plurality of optical fibers 5c~5f connected to each other via branching couplers 5g to form a tree structure. In this example, the branching optical fiber network consists of a first optical fiber 5c, an optical connector 5b for detachably connecting the first optical fiber 5c to the optical fiber cable 9, two second optical fibers 5d connected to the end of the first optical fiber 5c, four third optical fibers 5e connected to the ends of the second optical fibers 5d, and eight fourth optical fibers 5f connected to the ends of the third optical fibers 5e. Therefore, this optical fiber network has eight optical pathways branching from the optical connector 5b, and all the optical pathways have a constant length. The output ends of the fourth optical fibers 5f are arranged in parallel with the longitudinal direction of the base 5a and positioned at one end of the base 5a. As shown in FIG. 3B, the flexible base 5a is bent to form a cylindrical shape, and both sides of the flexible base 5a are bonded together. The outputs ends of the fourth optical fibers 5f are arranged to provide a constant interval therebetween in a circumferential direction. In this embodiment, eight optical pathways are formed in the optical distributor 5, and eight pin cards 6-1~6-8 are provided. However, the numbers of the optical pathways and the pin cards may be changed according to the number of pins of an integrated circuits to be inspected. The number of pin cards is not limited to being the same as the number of pins of the integrated circuit, but may be different from that of the number of pins of the integrated circuit, if necessary.

Figure 4:
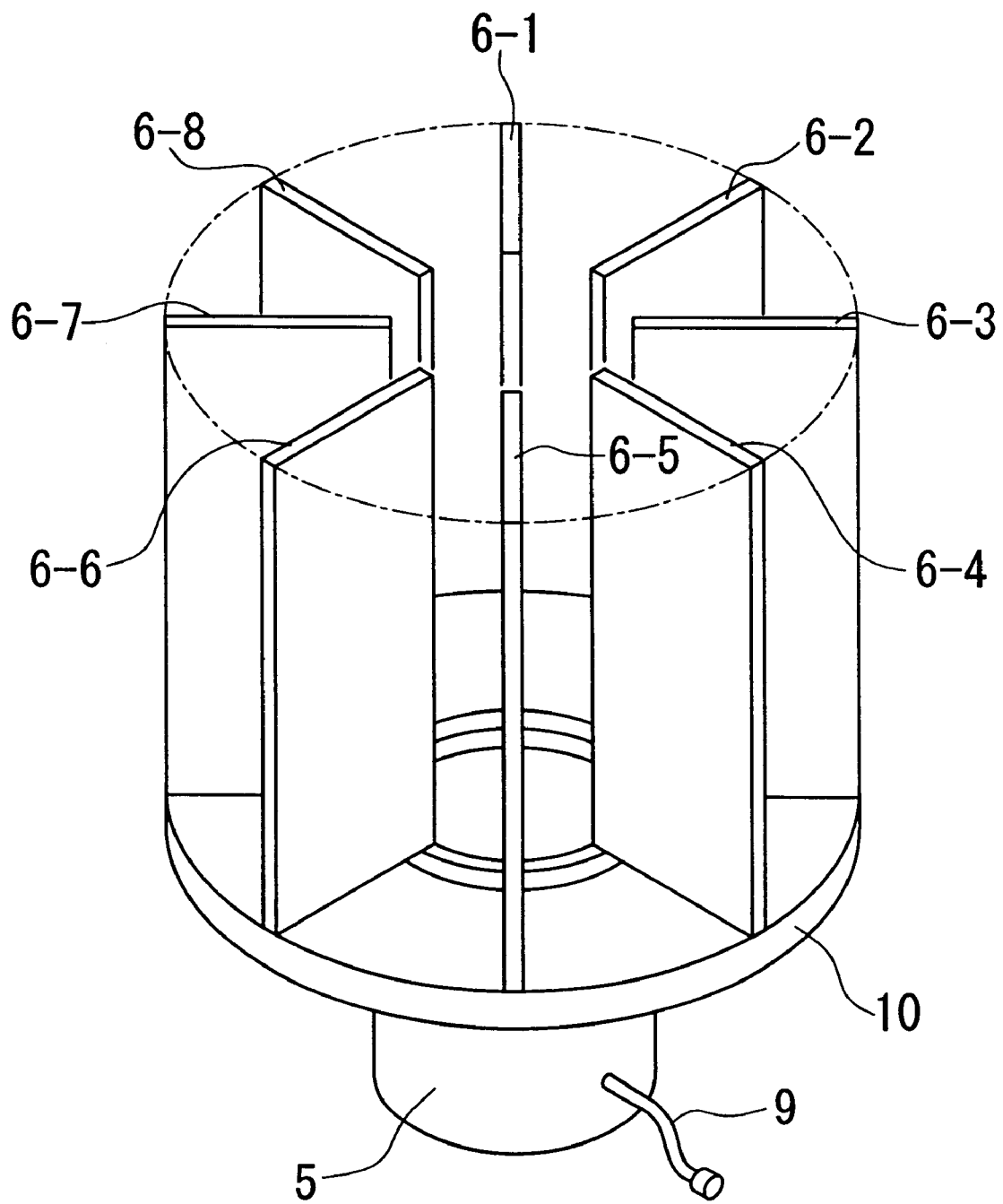
FIG. 4 is a perspective diagram illustrating an assembly of pin cards and the optical distributor.

FIG. 4 illustrates an assembly consisting of the optical distributor 5, a mother board 10, and the pin cards 6-1~6-n. The mother board 10 has a ring shape, and is coaxially arranged around the output side end (the side of the fourth optical fibers 5f) of the cylindrical optical distributor 5. The pin cards 6-1~6-n are perpendicularly fixed on the mother board 10 spokewise around the optical distributor 5 so that constant intervals are formed between the neighboring pin cards.

Figure 5:
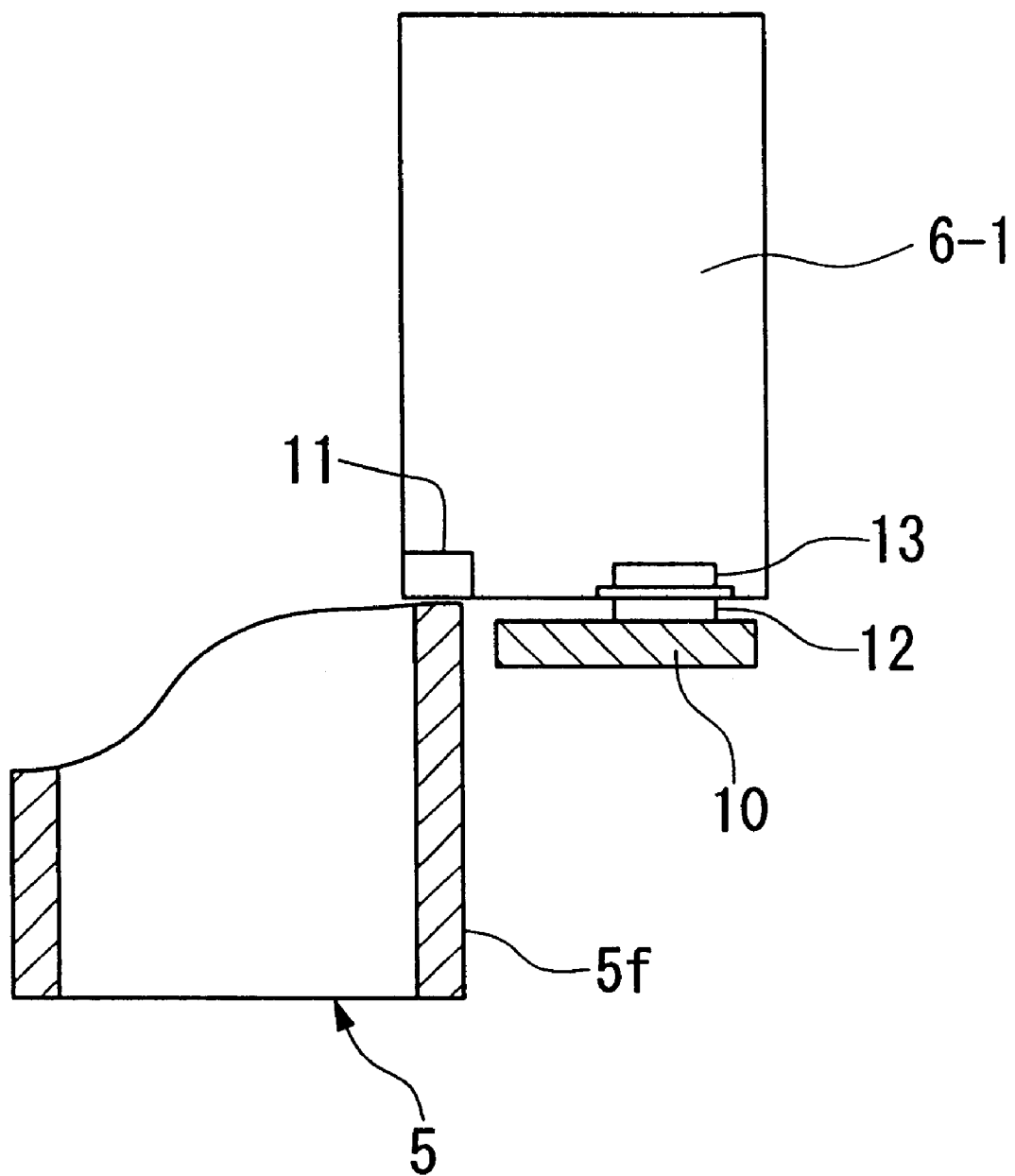
FIG. 5 is a sectional diagram illustrating the connection between the optical distributor and the pin cards.

As shown in FIG. 5, the pin cards 6-1~6-n respectively comprise light receiving elements 11, and each light receiving element 11 is arranged to face, or optically coupled to, each output end of the fourth optical fibers 5f in order to receive the distributed master clock signal. Thus, optical couplings are provided between the optical distributor 5 and the pin cards 6-1~6-n. It is preferable to provide, between the optical distributor 5 and the pin cards 6-1~6-n, an engaging structure such as positioning pins and pin holes for improving the relative positioning accuracy of the optical distributor 5 and the pin cards. The optical couplings are not limited to the structure shown in FIG. 5, but conventional optical connectors may be used for the optical coupling between the optical distributor 5 and each pin card. The mother board 10 comprises connectors 12 to which the phase control signal are applied from the timing signal generating unit 2. Each of the pin card 6-1~6-n comprises a connector 13 electrically connected to the phase control circuit 6b, and the corresponding connectors 12 and 13 are connected to each other.

Figure 6A:
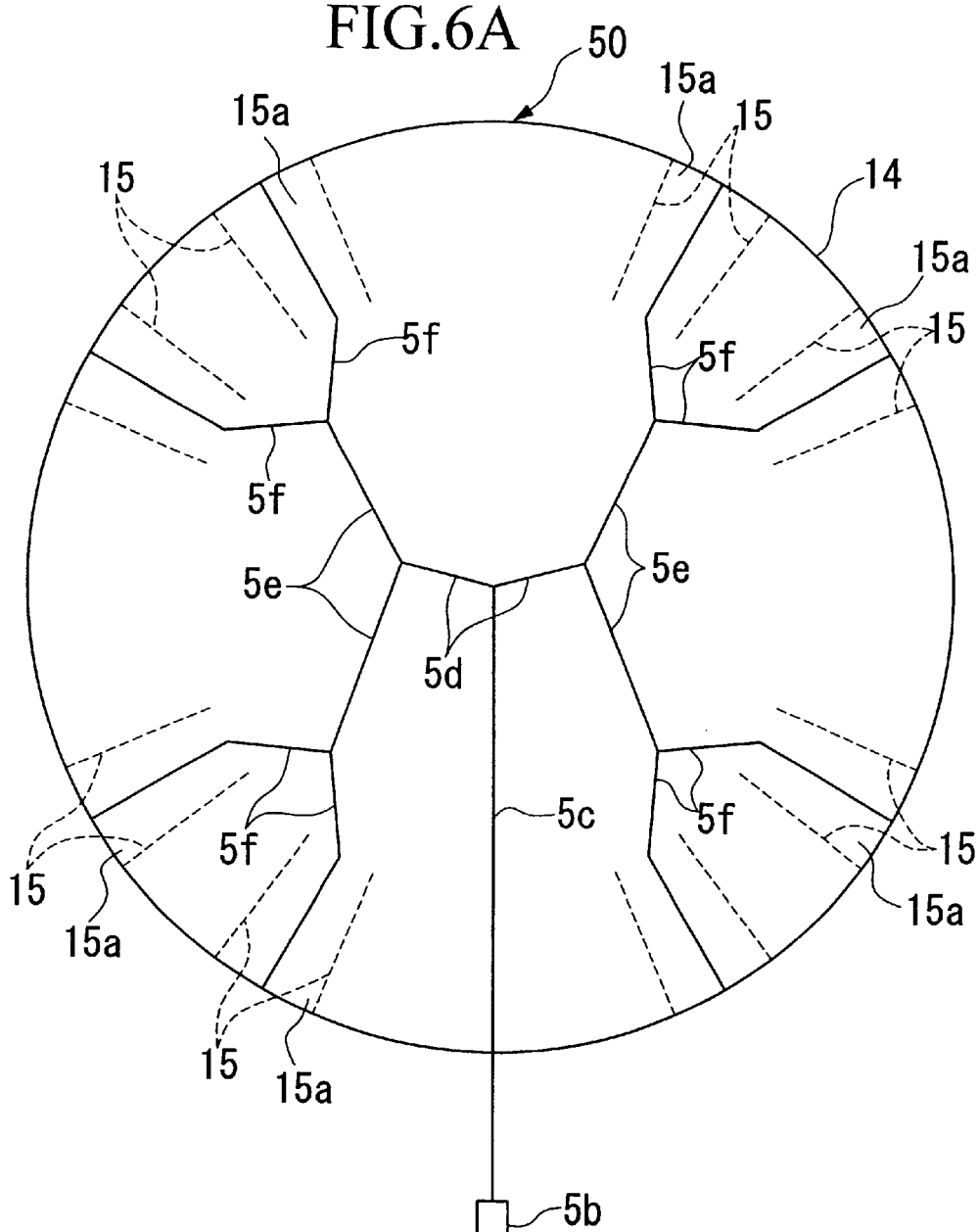
FIGS. 6A and 6B are schematic diagrams illustrating another example of the optical distributor.
Figure 6B:
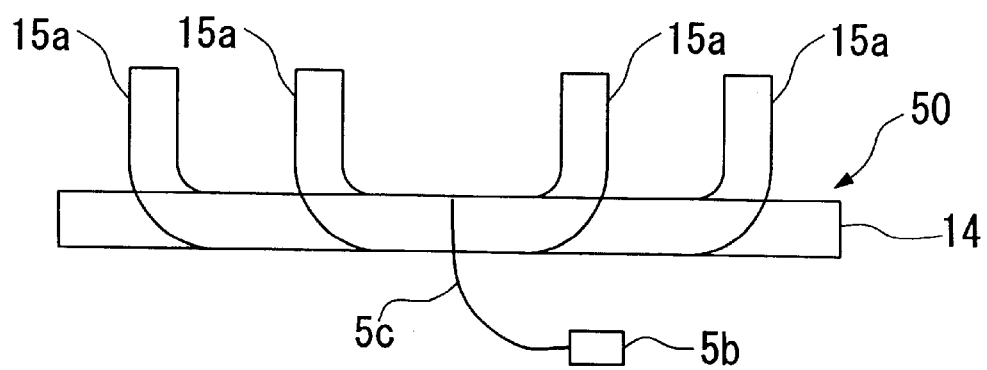

FIGS. 6A and 6B illustrate another example of the optical distributor. As shown in FIG. 6A, this optical distributor 50 comprises a support plate 14 having a disk shape and a branching optical fiber network (5c~5f) fixed on the support plate 14 so as to form a tree structure and radially branch from the center to the periphery of the support plate 14. The optical fiber network consists of a first optical fiber 5c, an optical connector 5b for detachably connecting the first optical fiber 5c to the optical fiber cable 9, two second optical fibers 5d connected to the end of the first optical fiber 5c, four third optical fibers 5e connected to the ends of the second optical fibers 5d, and eight fourth optical fibers 5f connected to the ends of the third optical fibers 5e. Therefore, this optical fiber network has eight optical pathways branching from the optical connector 5b, and all the optical pathways have a constant length. The output ends of the fourth optical fibers 5f are radially arranged at the periphery of the support plate 14 while placing a constant interval therebetween. Furthermore, a pair of slits 15 are formed in the support plate 14 at both sides of each end of the fourth optical fiber to form strip portions 15a, and, as shown in FIG. 6B, the strip portions 15a are bent so as to form protrusions perpendicularly standing up from the support plate 14. Thus, the output ends of the fourth optical fibers 5f are arranged in parallel with each other with a constant interval therebetween in a circumferential direction of the support plate 14.

This optical distributor 50 can be used in the same manner as that shown in FIGS. 4 and 5. That is, a mother board 10 having a ring shape is coaxially arranged around the upper ends of the strip portions 15a, and a plurality of pin cards 6-1~6-n are perpendicularly fixed on the mother board 10 spokewise around the optical distributor 50 so that constant intervals are formed between the neighboring pin cards. Furthermore, each light receiving element 11 of the pin cards 6-1~6-n (in this case, n=8) is arranged to face, or optically coupled to, each output end of the fourth optical fibers 5f to form an optical coupling. Thus, an optical signal input to the optical connector 5b is equally distributed into eight optical signals and the distributed signals are respectively input into the pin cards 6-1~6-n.

Next, the function of the inspection apparatus of the present embodiment will be explained. First, in the test signal generating device 1, the timing signal generating unit 2 electrically generates a master clock signal as a test signal. The master clock signal is transmitted to the electro-optic conversion circuit 3, and is converted into an optical master clock signal. The optical master clock signal is transmitted to the optical distributor 5 shown in FIGS. 3A and 3B (or the optical distributor 50 shown in FIGS. 6A and 6B) via the optical fiber cable 9, and is equally distributed into a plurality of distributed optical master clock signals. Because the branching optical pathways formed in the optical distributor 5 (or 50) are equal to each other, the distributed optical master clock signals have the same propagation delay.

The pin cards 6-1~6-n simultaneously receive the distributed optical master clock signals via the light receiving elements 11, and each photo-electric conversion circuit 6a converts the distributed optical master clock signals into electrical master clock signals and transmits the electrical master clock signals to the phase control circuit 6b.

Figure 7:
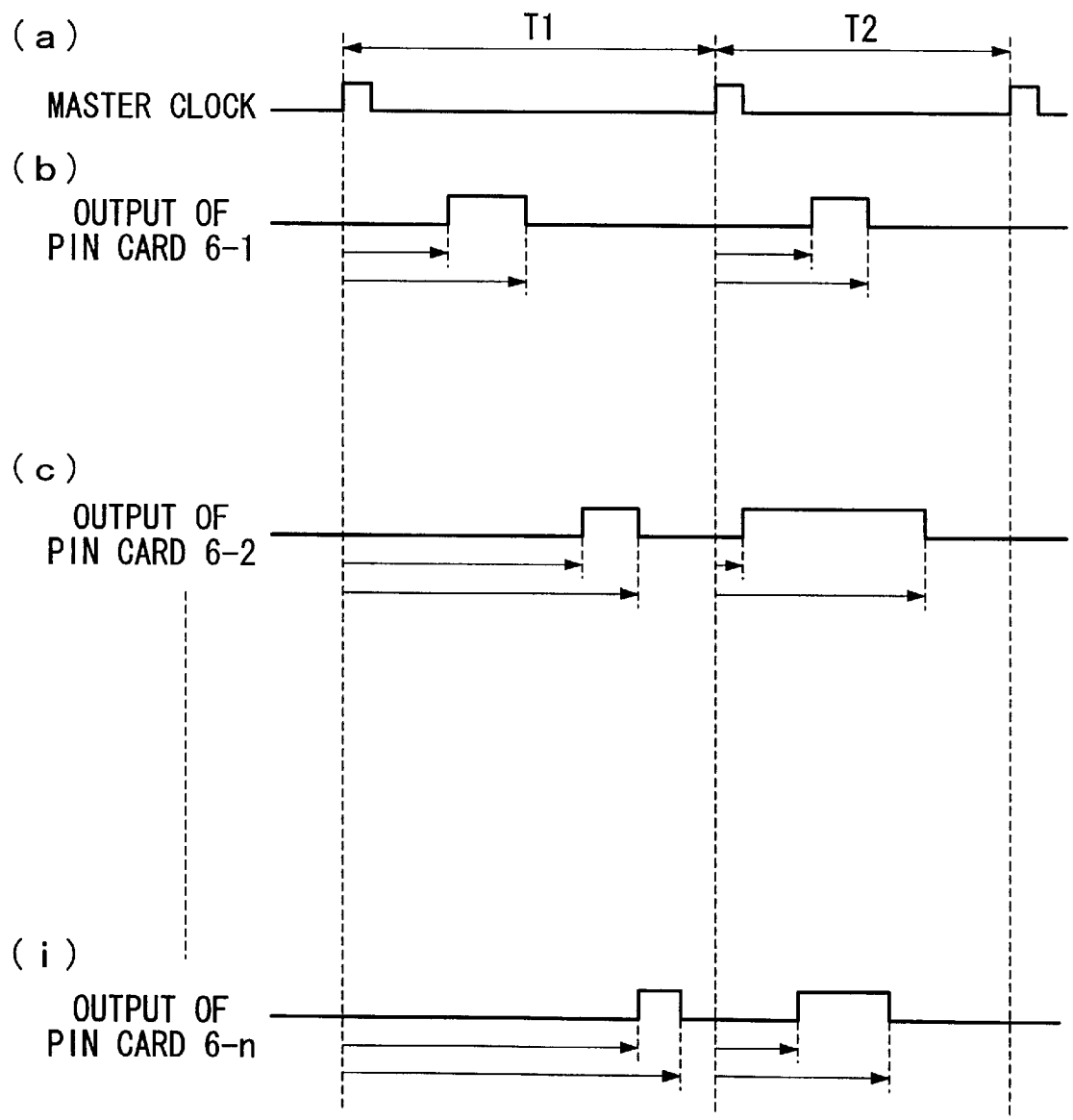
FIG. 7 is a timing chart illustrating waveforms of master clock signal and electrical test signals output from the pin cards.

On the other hand, the timing signal generating unit 2 generates a plurality of phase control signals for respectively controlling the pin cards 6-1~6-n, and the phase control signals are respectively transmitted to the phase control circuits 6b in the corresponding pin cards 6-1~6-n via the electrical cable 8. Each phase control circuit 6b generates an electrical test signal, using the electrical master clock signal received from the photo-electric conversion circuit 6a as a reference signal, by delaying the phase of the electrical master clock signal by a time designated by the phase control signal received from the timing signal generating unit 2. For example, FIG. 7(a) illustrates the electrical master clock signal, and FIGS. 7(b)~(i) illustrate the phase-delayed electrical test signals output from the pin cards 6-1~6-n. These phase-delayed electrical test signals (for example, time base signals) are respectively applied to the corresponding pins of an integrated circuit mounted on the pin cards, and the inspection of the integrated circuit is performed to determine the quality thereof.

In the case where the number of the optical pathways in the optical distributor 5 (or 50) is large and the optical loss is large, it is preferable to provide an optical amplifier between the electro-optic conversion circuit 3 and the optical distributor 5. This optical amplifier can be provided in the test signal generating device 1, or in the way of the optical cable 9, or in the test head device 4. Instead, a plurality of optical amplifiers may be provided in the optical fiber network or between the optical distributor 5 and the pin cards 6-1~6-n.

Figure 8:
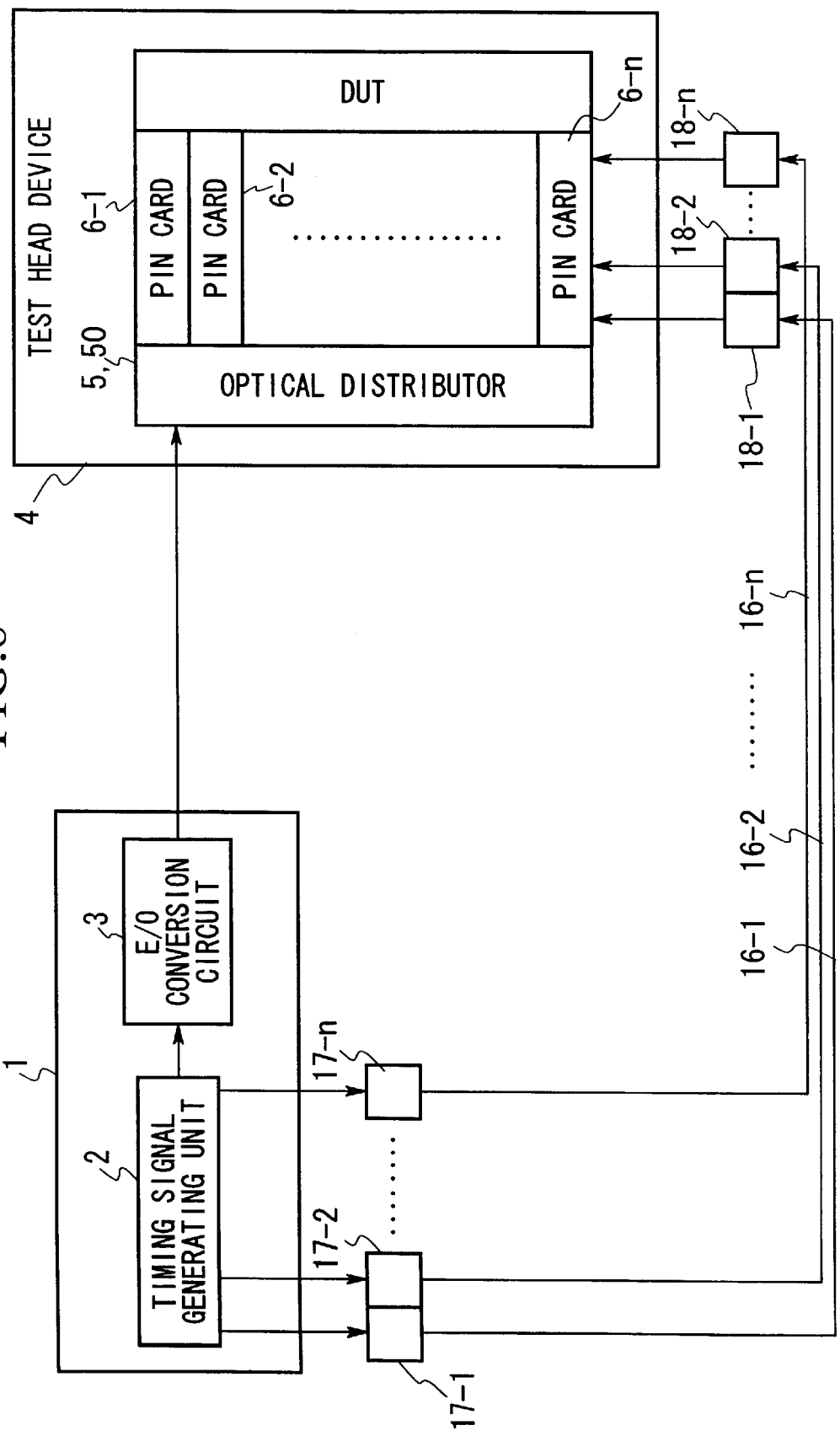
FIG. 8 is a block diagram illustrating a second embodiment of the present invention.

FIG. 8 illustrates a second embodiment of the present invention. This inspection apparatus is characterized in that a plurality of optical fiber cables 16-1~16-n are used, instead of the electrical cables 8 shown in FIG. 1, for transmitting phase control signals from the timing signal generating unit 2 to the pin cards 6-1~6-n. In this embodiment, electro-optic (E/O) conversion circuits 17-1~17-n are provided at the side of the test signal generating device 1 for respectively converting the phase control signals output from the timing signal generating unit 2 to optical phase control signals. Furthermore, at the side of the test head device 4, a plurality of photo-electric (O/E) conversion circuits 18-1~18-n are provided for respectively reconverting the optical phase control signals to electrical phase control signals. The electro-optic conversion circuits 17-1~17-n are respectively connected to the photo-electric (O/E) conversion circuits 18-1~18-n via optical fiber cables 16-1~16-n, and these optical fiber cables 16-1~16-n are preferably integrated into a ribbon cable so that the hard wiring of the cables 16-1~16-n becomes easy.

Figure 9:
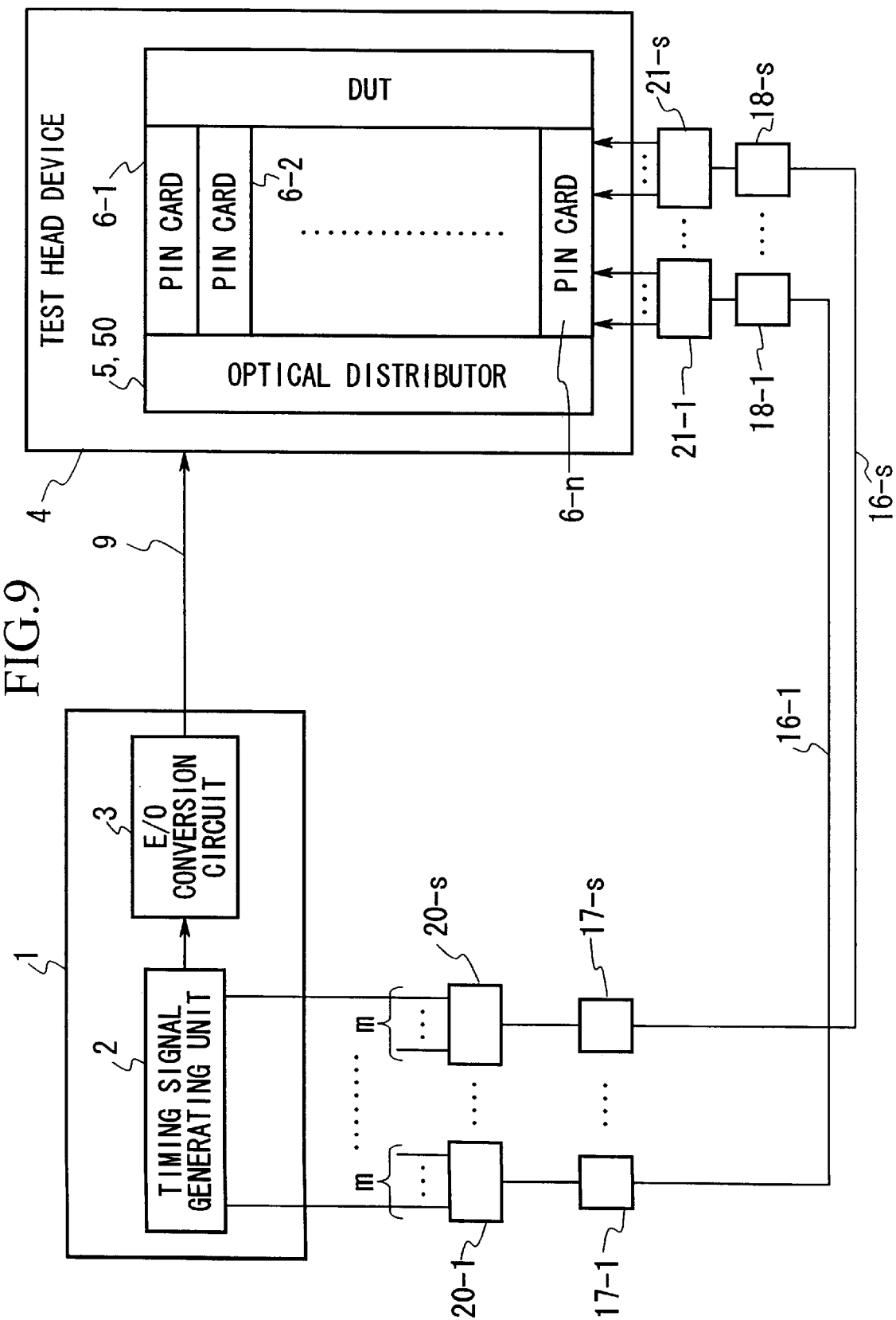
FIG. 9 is a block diagram illustrating a third embodiment of the present invention.

In the embodiment shown in FIG. 8, because it is necessary to provide the same number of optical fiber cables 16-1~16-n as there are pin cards 6-1~6-n, in the case where the number of the pin cards is large, the arrangement and connection of the optical fiber cables becomes difficult. In such a case, it is preferable to provide at least a parallel-serial converter for performing parallel-serial conversion of all or a part of the phase control signals output from the timing signal generating unit 2, and at least a serial-parallel converter for performing serial-parallel conversion of the serial converted signal(s). For example, if a parallel-serial converter can convert "m" number of the phase control signals into one serial signal, as shown in FIG. 9, "s" (=n/m) number of parallel-serial converters 20-1~20-s are connected to the timing signal generating unit 2, and the parallel-serial converters 20-1~20-s are respectively connected to the same number of electro-optic conversion circuits 17-1~17-s. The electro-optic conversion circuits 17-1~17-s are respectively connected via the same number of optical fiber cables 16-1~16-s to the same number of photo-electric conversion circuits 18-1~18-s, and the photo-electric conversion circuits 18-1~18-s are respectively connected to the same number of photo-electric conversion circuits 21-1~21-s. Each photo-electric conversion circuit reconverts one serial signal into "m" number of electrical phase control signal, and "n" number of electrical phase control signals are transmitted to the "n" number of pin cards 6-1~6-n. Therefore, the number of the optical fiber cables 16-1~16-s can be reduced to "n/m", and the arrangement and connection of the optical fiber cables can be facilitated.

In the above embodiments, one optical distributor 5 (or 50) is used; however, it is also possible to use a plurality of optical distributors (optical distributor unit) connected to each other in series. In this case, it is possible to distribute optical master clock signal into larger number of signals than that of the above embodiments.

The branch couplers connecting optical fibers in the optical distributor are preferably optical couplers made of a plastic so that the optical distributor can be flexibly deformed. However, it is also possible to fusion splice the ends of the optical fibers to provide a fusion splicing coupling, and to deform the fusion splicing couplings so as to bend the optical distributor.

The present invention is not limited to the above embodiments, and various modifications can be applied in the scope of the present invention.

What is claimed is:

1. An apparatus for inspecting integrated circuits, comprising:
    a test signal generating device that outputs an optical test signal;
    an optical distributor that distributes the optical test signal into a plurality of distributed optical signals by transmitting the optical test signal through a branching optical fiber network, wherein the optical distributor comprises a body having a cylindrical shape, and the branching optical fiber network is fixed on the surface of the body so that output ends of the optical fiber network are arranged on an end of the body while forming a constant interval between neighboring output ends of the optical fiber network; and
    a plurality of pin cards each of which generates an electro test signal by performing phase adjustment of each distributed optical signal;
    wherein the pin cards are arranged so as to apply the electrical test signals to pins of an integrated circuit to be inspected.

2. An apparatus according to claim 1, wherein the optical fiber network comprises a plurality of optical fibers connected to each other via branch couplers to form a branching tree structure.

3. An apparatus according to claim 1, wherein the test signal generating device further outputs phase control signals, and each pin card generates the electrical test signal having a phase delayed from that of the distributed optical signal by a time specified by each phase control signal.

4. An apparatus according to claim 1, wherein only one optical fiber is provided for transmitting the optical test signal to the optical distributor as a master clock signal which is a reference signal for the inspection.

5. An apparatus for inspecting integrated circuits, comprising:
    a test signal generating device that outputs an optical test signal;
    an optical distributor that distributes the optical test signal into a plurality of distributed optical signals by transmitting the optical test signal through a branching optical fiber network, wherein the optical distributor has a cylindrical shape and is formed by bending a flexible plate on which the branching optical fiber network is fixed, and the branching optical fiber network consists of a plurality of optical fibers connected to each other via branching couplers to form a tree structure; and
    a plurality of pin cards each of which generates an electro test signal by performing phase adjustment of each distributed optical signal;
    wherein the pin cards are arranged so as to apply the electrical test signals to pins of an integrated circuit to be inspected.

6. An apparatus for inspecting integrated circuits, comprising:
    a test signal generating device that outputs an optical test signal;
    an optical distributor that distributes the optical test signal into a plurality of distributed optical signals by transmitting the optical test signal through a branching optical fiber network, wherein the optical distributor comprises a body having a disk portion and a plurality of protrusions standing up from the disk portion, and the branching optical fiber network is fixed on the disk portion so that each of the output ends of the optical fiber network is fixed along each protrusion; and
    a plurality of pin cards each of which generates an electro test signal by performing phase adjustment of each distributed optical signal;
    wherein the pin cards are arranged so as to apply the electrical test signals to pins of an integrated circuit to be inspected.

7. An apparatus for inspecting integrated circuits, comprising:
    a test signal generating device that outputs an optical test signal;
    an optical distributor that distributes the optical test signal into a plurality of distributed optical signals by transmitting the optical test signal through a branching optical fiber network, wherein the optical distributor has a disk shape and is formed by: providing the branching optical fiber network on a disk shaped plate so that terminal optical fibers of the optical fiber network are arranged radically toward the periphery of the plate; cutting the plate at both sides of the terminal optical fibers to form strip portions; and bending the strip portions so that they stand perpendicular to the disk shaped plate; and
    a plurality of pin cards each of which generates an electro test signal by performing phase adjustment of each distributed optical signal;
    wherein the pin cards are arranged so as to apply the electrical test signals to pins of an integrated circuit to be inspected.

8. An apparatus according to claim 1, wherein each of the pin cards comprises a light receiving element disposed facing each of the output ends of the optical fiber network for receiving each distributed optical signal.

9. An apparatus according to claim 1, wherein the branching optical fiber network has a plurality of optical pathways extending from an input end to each output end thereof, and all the optical pathways have a constant length.

10. An apparatus according to claim 1, wherein the branching optical fiber network consists of a plurality of optical fiber network units connected to each other in series.

11. An apparatus according to claim 1, further comprising an optical amplifier provided between the test signal generating device and the optical distributor for amplifying the optical test signal and applying amplified optical signals to the optical distributor.

12. An apparatus according to claim 1, wherein each of the pin cards comprises a light receiving element, and the pin cards are arranged spokewise around the optical distributor so that each light receiving element of each pin card faces each output end of the optical distributor.

* * * * *